US009029708B2

(12) United States Patent
Oosawa et al.

(10) Patent No.: US 9,029,708 B2
(45) Date of Patent: May 12, 2015

(54) PRINTED CIRCUIT BOARD AND METHOD OF MANUFACTURING THE SAME

(75) Inventors: Tetsuya Oosawa, Ibaraki (JP); Mitsuru Honjo, Ibaraki (JP); Daisuke Yamauchi, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 871 days.

(21) Appl. No.: 13/086,449

(22) Filed: Apr. 14, 2011

(65) Prior Publication Data
US 2011/0259632 A1 Oct. 27, 2011

Related U.S. Application Data

(60) Provisional application No. 61/333,507, filed on May 11, 2010.

(30) Foreign Application Priority Data

Apr. 26, 2010 (JP) .................... 2010-101352

(51) Int. Cl.
*H05K 1/00* (2006.01)
*H05K 1/05* (2006.01)
*H05K 1/02* (2006.01)

(52) U.S. Cl.
CPC .............. *H05K 1/056* (2013.01); *H05K 1/0245* (2013.01); *H05K 1/0251* (2013.01)

(58) Field of Classification Search
CPC .... H05K 1/0245; H05K 1/056; H05K 1/0251
See application file for complete search history.

(56) References Cited

U.S. PATENT DOCUMENTS

| 5,717,547 | A | * | 2/1998 | Young ........................ 360/246 |
| 7,132,607 | B2 | * | 11/2006 | Yoshimi et al. .............. 174/255 |
| 7,923,644 | B2 | * | 4/2011 | Ishii et al. ..................... 174/254 |
| 8,138,427 | B2 | * | 3/2012 | Ishii et al. ..................... 174/261 |
| 2004/0070884 | A1 | | 4/2004 | Someya et al. |
| 2004/0245015 | A1 | | 12/2004 | Yoshimi et al. |
| 2005/0280944 | A1 | | 12/2005 | Yang et al. |
| 2007/0141864 | A1 | | 6/2007 | Kataoka |
| 2008/0047739 | A1 | | 2/2008 | Ishii et al. |

(Continued)

FOREIGN PATENT DOCUMENTS

| CN | 1178965 A | 4/1998 |
| JP | H08-130390 A | 5/1996 |
| JP | H10-124837 A | 5/1998 |

(Continued)

OTHER PUBLICATIONS

Office Action issued Nov. 12, 2013 in JP Application No. 2010-101352.

(Continued)

*Primary Examiner* — Ishwarbhai B Patel
(74) *Attorney, Agent, or Firm* — Panitch Schwarze Belisario & Nadel LLP

(57) ABSTRACT

A base insulating layer is formed on a suspension body. Read wiring patterns, write wiring patterns and a ground pattern are formed in parallel on the base insulating layer. A first cover insulating layer is formed on the base insulating layer to cover the read wiring patterns, the write wiring patterns and the ground pattern. A ground layer is formed in a region on the first cover insulating layer above the write wiring patterns. A second cover insulating layer is formed on the first cover insulating layer to cover the ground layer.

6 Claims, 11 Drawing Sheets

(56) References Cited

U.S. PATENT DOCUMENTS

2009/0242259 A1* 10/2009 Ho et al. ............... 174/261
2010/0116537 A1   5/2010 Ishii et al.

FOREIGN PATENT DOCUMENTS

| | | |
|---|---|---|
| JP | 2002-289992 A | 10/2002 |
| JP | 2004-133988 A | 4/2004 |
| JP | 2004-363281 A | 12/2004 |
| JP | 2006-004599 A | 1/2006 |
| JP | 2009-176395 A | 8/2009 |
| JP | 2009-246092 A | 10/2009 |
| JP | 2009-260056 A | 11/2009 |
| JP | 2010114366 A | 5/2010 |

OTHER PUBLICATIONS

Office Action issued Aug. 20, 2013 in JP Application No. 2010-101352.

Office Action issued Jul. 2, 2014 in CN Application No. 201110105399.6.

* cited by examiner (a)

TRANSMISSION REGION

INTERSECTION REGION (b)

TRANSMISSION REGION

INTERSECTION REGION (c)

TRANSMISSION REGION

INTERSECTION REGION

PRINTED CIRCUIT BOARD AND METHOD OF MANUFACTURING THE SAME

BACKGROUND OF THE INVENTION

1. Field of the Invention

The present invention relates to a printed circuit board and a method of manufacturing the same.

2. Description of the Background Art

Actuators are employed in drives such as hard disk drives. Such an actuator includes an arm arranged rotatably with respect to a rotation shaft and a suspension board used for a magnetic head that is attached to the arm. The suspension board is a printed circuit board for positioning the magnetic head with a desired track of a magnetic disk.

FIG. 11 is a vertical sectional view of a conventional suspension board (see JP 2004-133988 A, for example).

In the suspension board 910, a first insulating layer 904 is formed on a metal substrate 902. A write wiring trace W12 and a read wiring trace R12 are formed to be spaced apart from each other by a distance L1 on the first insulating layer 904.

A second insulating layer 905 is formed on the first insulating layer 904 to cover the write wiring trace W12 and the read wiring trace R12. On the second insulating layer 905, a write wiring trace W11 is formed at a position above the read wiring trace R12, and a read wiring trace R11 is formed at a position above the write wiring trace W12.

Each of the distance between the read wiring trace R11 and the write wiring trace W12 that are positioned one above the other and the distance between the read wiring trace R12 and the write wiring trace W11 that are positioned one above the other is L2.

In the suspension board 910 having the foregoing configuration, the distances between the write wiring traces W11, W12 and the read wiring trace R11 are substantially equal to the distances between the write wiring traces W11, W12 and the read wiring trace R12, respectively. Accordingly, it is considered that the magnitude of induced electromotive forces generated in the read wiring traces R11, R12 are substantially equal when write currents pass through the write wiring traces W11, W12. This allows crosstalk between the write wiring traces W11, W12 and the read wiring traces R11, R12 to be reduced.

In recent years, recording densities of magnetic disks have been improved and a PMR (Perpendicular Magnetic Recording) system has been introduced, resulting in a growing need for larger currents for writing. Thus, impedances of wiring traces of magnetic heads and suspension boards need to be reduced.

BRIEF SUMMARY OF THE INVENTION

An object of the present invention is to provide a printed circuit board in which characteristic impedances of wiring patterns are reduced and a method of manufacturing the same.

(1) According to an aspect of the present invention, a printed circuit board includes a metal support substrate, a base insulating layer formed on the metal support substrate, first and second wiring patterns formed on the base insulating layer and constituting a signal line pair, a cover insulating layer formed on the base insulating layer to cover at least part of the first and second wiring patterns, and a ground layer provided on the cover insulating layer to be positioned above the first and second wiring patterns, wherein the first wiring pattern includes first and second lines, the second wiring pattern includes third and fourth lines, one ends of the first and second lines are electrically connected to each other, and the other ends of the first and second lines are electrically connected to each other, one ends of the third and fourth lines are electrically connected to each other, and the other ends of the third and fourth lines are electrically connected to each other, and any one of the first and second lines is arranged between the third and fourth lines, and any one of the third and fourth lines is arranged between the first and second lines.

In the printed circuit board, the any one of the first and second lines of the first wiring pattern is arranged between the third and fourth lines of the second wiring pattern, and the any one of the third and fourth lines of the second wiring pattern is arranged between the first and second lines of the first wiring pattern. In this case, three side surfaces out of one side surface and the other side surface of the first line and one side surface and the other side surface of the second line are opposite to three side surfaces out of one side surface and the other side surface of the third line and one side surface and the other side surface of the fourth line, respectively. This increases an area in which the first wiring pattern and the second wiring pattern are opposite to each other, thus increasing capacitances of the first and second wiring patterns. This results in reduced characteristic impedances of the first and second wiring patterns.

The first and second wiring patterns are opposite to the metal support substrate with the base insulating layer therebetween, and are opposite to the ground layer with the cover insulating layer therebetween. This further increases the capacitances of the first and second wiring patterns. This results in further reduced characteristic impedances of the first and second wiring patterns.

(2) A first intersection region in which the first or second line of the first wiring pattern and the third or fourth line of the second wiring pattern intersect with each other may be provided, a second intersection region in which the first or second line of the first wiring pattern and the third or fourth line of the second wiring pattern intersect with each other may be provided, a portion of the first or second line of the first wiring pattern arranged in the first intersection region may be divided, a portion of the third or fourth line of the second wiring pattern arranged in the first intersection region may be arranged on the base insulating layer to pass through a portion in between divided portions of the first or second line of the first wiring pattern, the cover insulating layer may include a first cover portion having first and second through holes and provided to cover the first and second wiring patterns in the first intersection region, the ground layer may have a first connection region provided on the first cover portion and electrically separated from other regions of the ground layer, one of the divided portions of the first or second line of the first wiring pattern may be electrically connected to the first connection region through the first through hole of the first cover portion, the other one of the divided portions of the first or second line of the first wiring pattern may be electrically connected to the first connection region through the second through hole of the first cover portion.

In this case, the first or second line of the first wiring pattern and the third or fourth line of the second wiring pattern can intersect with each other while electrical connection between the first and second lines of the first wiring pattern is maintained in the first intersection region. This allows the first to fourth lines to be arranged in respective desired positions with simple configuration.

In the first intersection region, the divided portions of the first or second line of the first wiring pattern are electrically connected to each other through the first connection region that is part of the ground layer, thus eliminating the need to separately form another layer and suppressing complicated manufacturing steps.

(3) The cover insulating layer may include a second cover portion having third and fourth through holes and provided to cover the first and second wiring patterns in the second intersection region, the ground layer may further include a second connection region provided on the second cover portion and electrically separated from the other regions of the ground layer, a portion of the third or fourth line of the second wiring pattern arranged in the second intersection region may be divided, a portion of the first or second line of the first wiring pattern arranged in the second intersection region may be arranged on the base insulating layer to pass through a portion in between divided portions of the third or fourth line of the second wiring pattern, and one of the divided portions of the third or fourth line of the second wiring pattern may be electrically connected to the second connection region through the third through hole of the second cover portion, and the other one of the divided portions of the third or fourth line of the second wiring pattern may be electrically connected to the second connection region through the fourth through hole of the second cover portion.

In this case, the third or fourth line of the second wiring pattern and the first or second line of the first wiring pattern can intersect with each other while electrical connection between the third and fourth lines of the second wiring pattern is maintained in the second intersection region. This allows the first to fourth lines to be arranged in respective desired positions with simple configuration.

In the second intersection region, the divided portions of the third or fourth line of the second wiring pattern are electrically connected to each other through the second connection region that is part of the ground layer, thus eliminating the need to separately form another layer and suppressing complicated manufacturing steps.

The divided portions of the first or second line of the first wiring pattern are connected to each other and the divided portions of the third or fourth line of the second wiring pattern are connected to each other with the same configurations in the first and second intersection regions. Thus, a balance between the first wiring pattern and the second wiring pattern is ensured. This results in good transmission characteristics in the first wiring pattern and the second wiring pattern.

(4) The other regions excluding the first and second connection regions of the ground layer may be electrically connected to the metal support substrate. In this case, the ground layer is prevented from being electrically charged. This prevents transmission characteristics in the first and second wiring patterns from being degraded.

(5) A thickness of the cover insulating layer may be smaller than a thickness of the base insulating layer. In this case, a distance from the ground layer to the first and second wiring patterns is reduced by decreasing the thickness of the cover insulating layer. This further reduces the characteristic impedances of the first and second wiring patterns. When another wiring pattern is formed on the base insulating layer, the thickness of the cover insulating layer is reduced while the thickness of the base insulating layer is maintained, so that the characteristic impedances of the first and second wiring patterns can be reduced without reducing a characteristic impedance of the another wiring pattern.

(6) The printed circuit board may further include a fifth line branched from the one end of the first line or the one end of the second line, a sixth line branched from the other end of the first line or the other end of the second line, a seventh line branched from the one end of the third line or the one end of the fourth line, and an eighth line branched from the other end of the third line or the other end of the fourth line, wherein a width of each of the fifth line and the sixth line may be obtained by adding a width of the first line and a width of the second line, and a width of each of the seventh line and the eighth line may be obtained by adding a width of the third line and a width of the fourth line.

In this case, the integrated characteristic impedances of the first and second lines are equal to the characteristic impedance of each of the fifth and sixth lines in the first wiring pattern. Similarly, the integrated characteristic impedances of the third and fourth lines are equal to the characteristic impedance of each of the seventh and eighth lines in the second wiring pattern. This reduces transmission loss in the first and second wiring patterns.

(7) According to another aspect of the present invention, a method of manufacturing a printed circuit board includes the steps of forming a base insulating layer on a metal support substrate, forming first and second wiring patterns that constitute a signal line pair on the base insulating layer, forming a cover insulating layer on the base insulating layer to cover at least part of the first and second wiring patterns, and forming a ground layer on the cover insulating layer such that the ground layer is positioned above the first and second wiring patterns, wherein the step of forming the first and second wiring patterns includes the step of forming the first and second wiring patterns on the base insulating layer such that the first wiring pattern is composed of first and second lines and the second wiring pattern is composed of third and fourth lines, one ends of the first and second lines are electrically connected to each other, the other ends of the first and second lines are electrically connected to each other, one ends of the third and fourth lines are electrically connected to each other, the other ends of the third and fourth lines are electrically connected to each other, any one of the first and second lines of the first wiring pattern is positioned between the third and fourth lines of the second wiring pattern, and any one of the third and fourth lines of the second wiring pattern is positioned between the first and second lines of the first wiring pattern.

In the manufacturing method, the any one of the first and second lines of the first wiring pattern is arranged between the third and fourth lines of the second wiring pattern, and the any one of the third and fourth lines of the second wiring pattern is arranged between the first and second lines of the first wiring pattern. In this case, three side surfaces out of one side surface and the other side surface of the first line and one side surface and the other side surface of the second line are opposite to three side surfaces out of one side surface and the other side surface of the third line and one side surface and the other side surface of the fourth line, respectively. This increases an area in which the first wiring pattern and the second wiring pattern are opposite to each other, thus increasing capacitances of the first and second wiring patterns. This results in reduced characteristic impedances of the first and second wiring patterns.

The first and second wiring patterns are opposite to the metal support substrate with the base insulating layer therebetween, and are opposite to the ground layer with the cover insulating layer therebetween. Thus, the capacitances of the first and second wiring patterns are further increased. This results in further reduced characteristic impedances of the first and second wiring patterns.

According to the present invention, the characteristic impedances of the first and second wiring patterns are reduced.

Other features, elements, characteristics, and advantages of the present invention will become more apparent from the following description of preferred embodiments of the present invention with reference to the attached drawings.

DETAILED DESCRIPTION OF THE INVENTION

Figure 1:
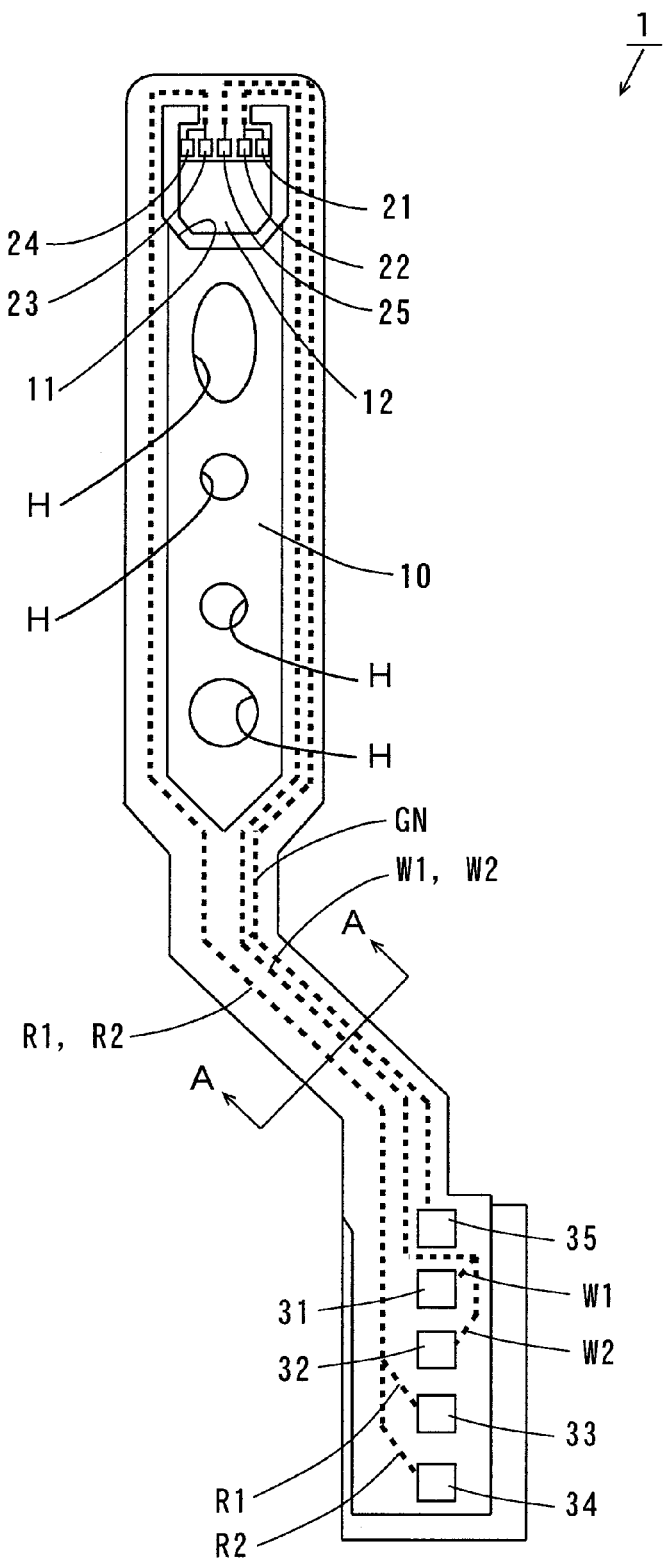
FIG. 1 is a plan view of a suspension board according to one embodiment of the present invention.

Hereinafter, a printed circuit board and a method of manufacturing the same according to one embodiment of the present invention will be described while referring to the drawings. Description will be made of the configuration and manufacturing method of a suspension board used in an actuator of a hard disk drive as the printed circuit board according to the one embodiment of the present invention.

(1) Configuration of the Suspension Board

FIG. 1 is a plan view of the suspension board according to the one embodiment of the present invention. As shown in FIG. 1, the suspension board 1 includes a suspension body 10 formed of a long-sized metal substrate. A plurality of holes H are formed in the suspension body 10. Write wiring patterns W1, W2, read wiring patterns R1, R2 and a ground pattern GN are formed on the suspension body 10 as indicated by the bold dotted lines. The write wiring pattern W1 and the write wiring pattern W2 constitute a signal line pair. The read wiring pattern R1 and the read wiring pattern R2 constitute a signal line pair.

At an end of the suspension body 10, a U-shaped opening 11 is formed to provide a magnetic head supporting portion (hereinafter referred to as a tongue) 12. Five electrode pads 21, 22, 23, 24, 25 are formed at an end of the tongue 12.

Five electrode pads 31, 32, 33, 34, 35 are formed at the other end of the suspension body 10. The electrode pads 21 to 24 on the tongue 12 and the electrode pads 31 to 34 at the other end of the suspension body 10 are electrically connected to one another through the write wiring patterns W1, W2 and the read wiring patterns R1, R2, respectively. The electrode pad 25 on the tongue 12 and the electrode pad 35 at the other end of the suspension body 10 are electrically connected to each other through the ground pattern GN. The ground pattern GN is electrically connected to the suspension body 10 as described below.

In the hard disk, which is not shown, including the suspension board 1, a current flows through the pair of write wiring patterns W1, W2 at the time of writing information in the magnetic disk. Moreover, the current flows through the pair of read wiring patterns R1, R2 at the time of reading information from the magnetic disk.

(2) The Write Wiring Patterns

Figure 2:
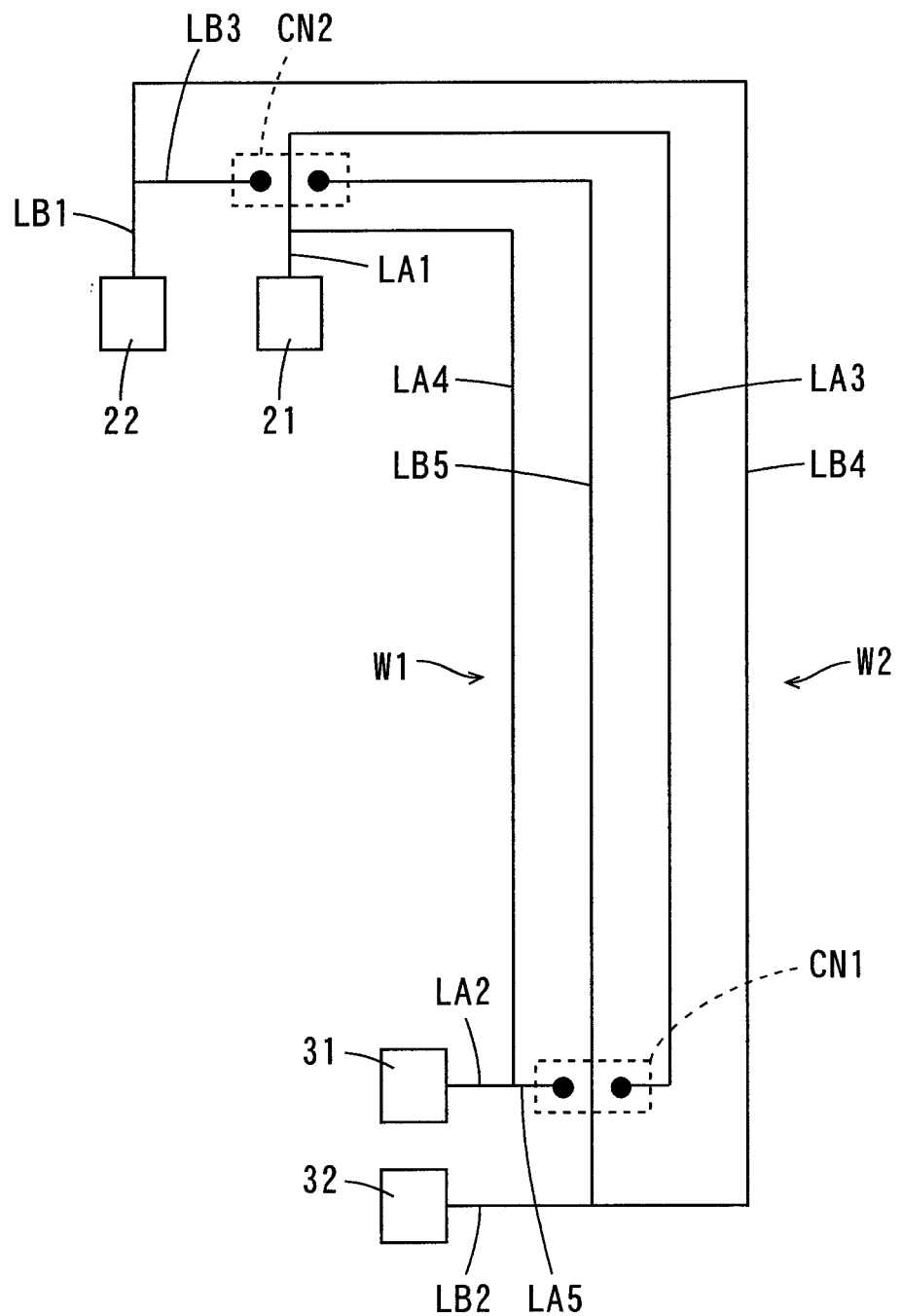
FIG. 2 is a schematic diagram showing the configurations of write wiring patterns.

Next, description will be made of the configurations of the write wiring patterns W1, W2. FIG. 2 is a schematic diagram showing the configurations of the write wiring patterns W1, W2.

As shown in FIG. 2, the write wiring pattern W1 is constituted by lines LA1 to LA5. The line LA1 is connected to the electrode pad 21, and the line LA2 is connected to the electrode pad 31.

One ends of the lines LA3, LA4 are integrated with the line LA1. The other end of the line LA3 and one end of the line LA5 are electrically connected to each other in an intersection region CN1. Details of the intersection region CN1 will be described below. The other ends of the lines LA4, LA5 are integrated with the line LA2.

The write wiring pattern W2 is constituted by lines LB1 to LB5. The line LB1 is connected to the electrode pad 22, and the line LB2 is connected to the electrode pad 32.

One ends of the lines LB3, LB4 are integrated with the line LB1. The other end of the line LB3 and one end of the line LB5 are electrically connected to each other in an intersection region CN2. Details of the intersection region CN2 will be described below. The other ends of the lines LB4, LB5 are integrated with the line LB2.

The lines LA3, LA4 of the write wiring pattern W1 and the lines LB4, LB5 of the write wiring pattern W2 are arranged in parallel with one another such that the line LA3 is positioned between the lines LB4, LB5, and the line LB5 is positioned between the lines LA3, LA4. The line LA3 of the write wiring pattern W1 extends to pass through a portion in between the ends of the lines LB3, LB5 of the write wiring pattern W2 in the intersection region CN2, and the line LB5 of the write wiring pattern W2 extends to pass through a portion in between the ends of the lines LA3, LA5 of the write wiring pattern W1 in the intersection region CN1.

Figure 3:
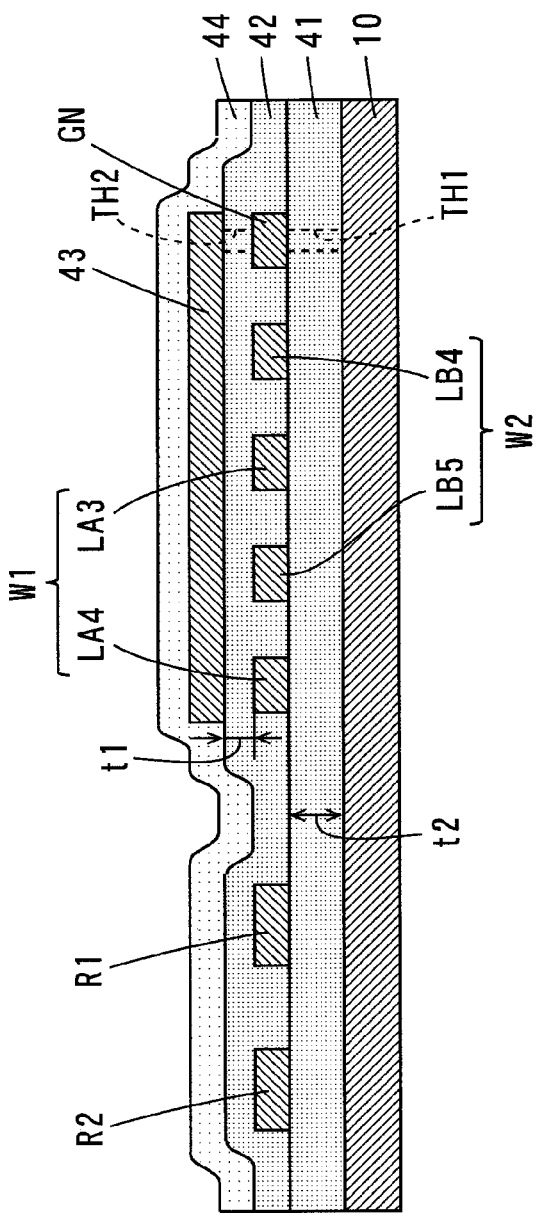
FIG. 3 is a sectional view of the suspension board taken along the line A-A of FIG. 1.

FIG. 3 is a sectional view of the suspension board 1 taken along the line A-A of FIG. 1. As shown in FIG. 3, a base insulating layer 41 is formed on the suspension body 10. The read wiring patterns R1, R2, the lines LA3, LA4, LB4, LB5 of the write wiring patterns W1, W2, and the ground pattern GN are formed in parallel on the base insulating layer 41. The ground pattern GN is electrically connected to the suspension body 10 through a through hole TH1 formed in the base insulating layer 41.

A first cover insulating layer 42 is formed on the base insulating layer 41 to cover the read wiring patterns R1, R2, the write wiring patterns W1, W2 and the ground pattern GN. A ground layer 43 is formed in a region on the first cover insulating layer 42 above the write wiring patterns W1, W2. A second cover insulating layer 44 is formed on the first cover insulating layer 42 to cover the ground layer 43.

The ground layer 43 is electrically connected to the ground pattern GN through a through hole TH2 formed in the first cover insulating layer 42. This causes the ground layer 43 to be electrically connected to the suspension body 10 through the ground pattern GN. The ground layer 43 may be directly connected to the suspension body 10 not through the ground pattern GN.

Figure 4:
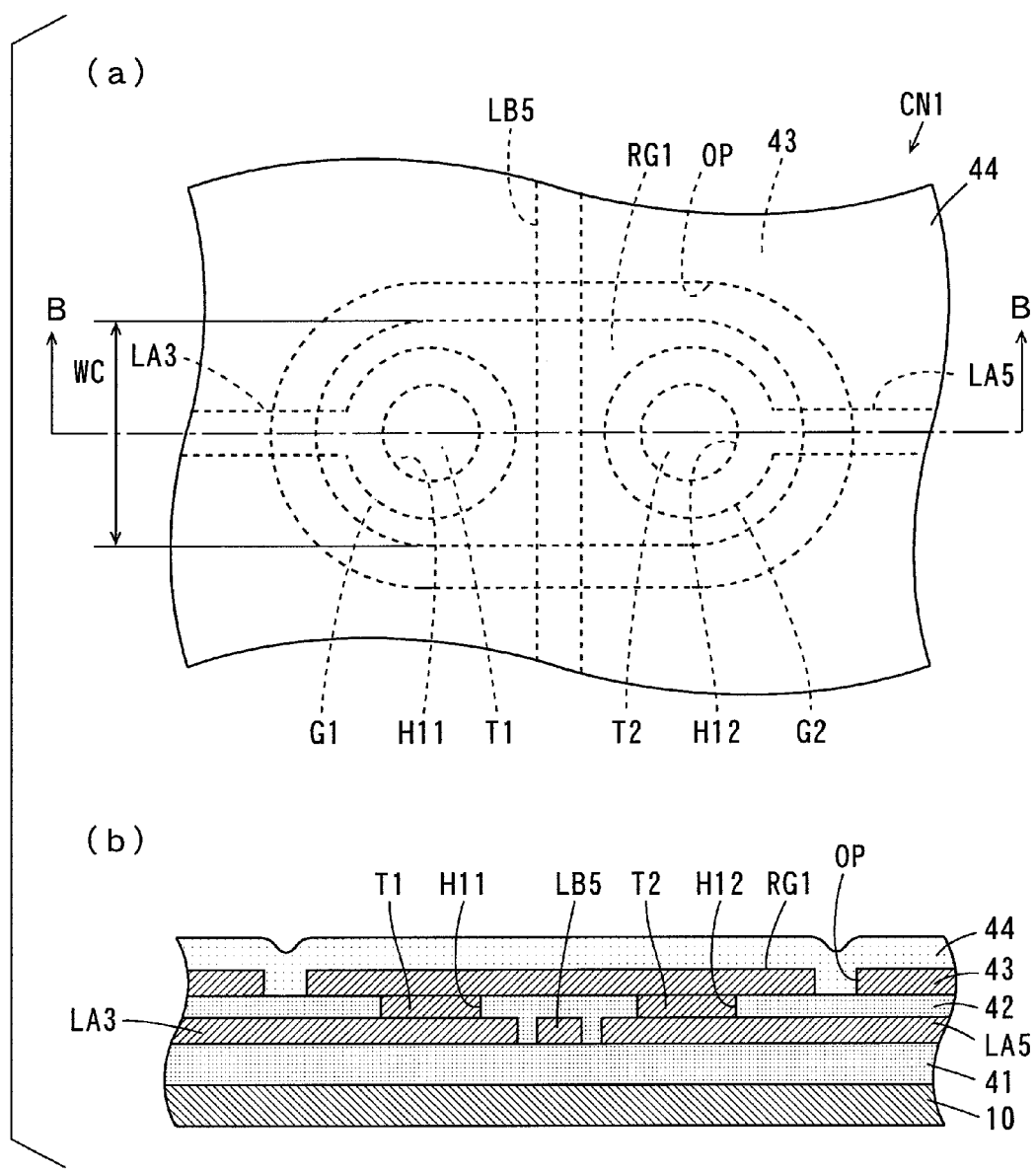
FIGS. 4(a), (b) are a plan view and a sectional view showing details of an intersection region of FIG. 2.

FIG. 4(a) is a plan view showing details of the intersection region CN1 of FIG. 2, and FIG. 4(b) is a sectional view taken along the line B-B of FIG. 4(a).

As shown in FIGS. 4(a) and (b), the end of the line LA3 and the end of the line LA5 are arranged on both sides of the line LB5. Circular connection portions G1, G2 are provided at the ends of the line LA3 and the line LA5, respectively. Through holes H11, H12 are formed in respective portions of the first cover insulating layer 42 above the connection portions G1, G2. Connecting layers T1, T2 made of copper, for example, are formed to fill the through holes H11, H12 of the first cover insulating layer 42.

An annular opening OP is formed in the ground layer 43. Thus, an elliptical region RG1 that is electrically separated from other regions of the ground layer 43 is provided to extend over the connecting layer T1 to the connecting layer T2. This causes the lines LA3, LA5 to be electrically connected to the region RG1 of the ground layer 43 through the connecting layers T1, T2, respectively. That is, the lines LA3, LA5 are electrically connected to each other through the region RG1 of the ground layer 43.

The diameter of the connection portion G1 is preferably larger than the width of the line LA3, and the diameter of the connection portion G2 is preferably larger than the width of the line LA5. The diameter of the connecting layer T1 (through hole H11) in its transverse cross section is preferably larger than the width of the line LA3, and the diameter of the connecting layer T2 (through hole H12) in its transverse cross section is preferably larger than the width of the line LA5. Thus, the electrical connection between the lines LA3, LA5 is sufficiently ensured.

The width WC of the connecting layer RG1 is preferably constant in its portion between the connecting layers T1, T2. In the case, transmission loss in the connecting layer RG1 is reduced.

The shape of each of the connection portions G1, G2 is not limited to the circular shape. For example, another shape such as an elliptical shape, a triangular shape, a quadrangular shape or a shape of a sector may be employed. The transverse cross sectional shape of each of the connecting layers T1, T2 (through holes H11, H12) is not limited to the circular shape. For example, another shape such as an elliptical shape, a triangular shape, a quadrangular shape or a shape of a sector may be employed. The shape of the connecting layer RG1 is not limited to the elliptical shape. For example, another shape such as a rectangular shape may be employed.

The intersection region CN2 has the same configuration as the intersection region CN1. That is, the lines LB3, LB5 are electrically connected to each other through the region RG1 that is separated from other regions of the ground layer 43.

Figure 5:
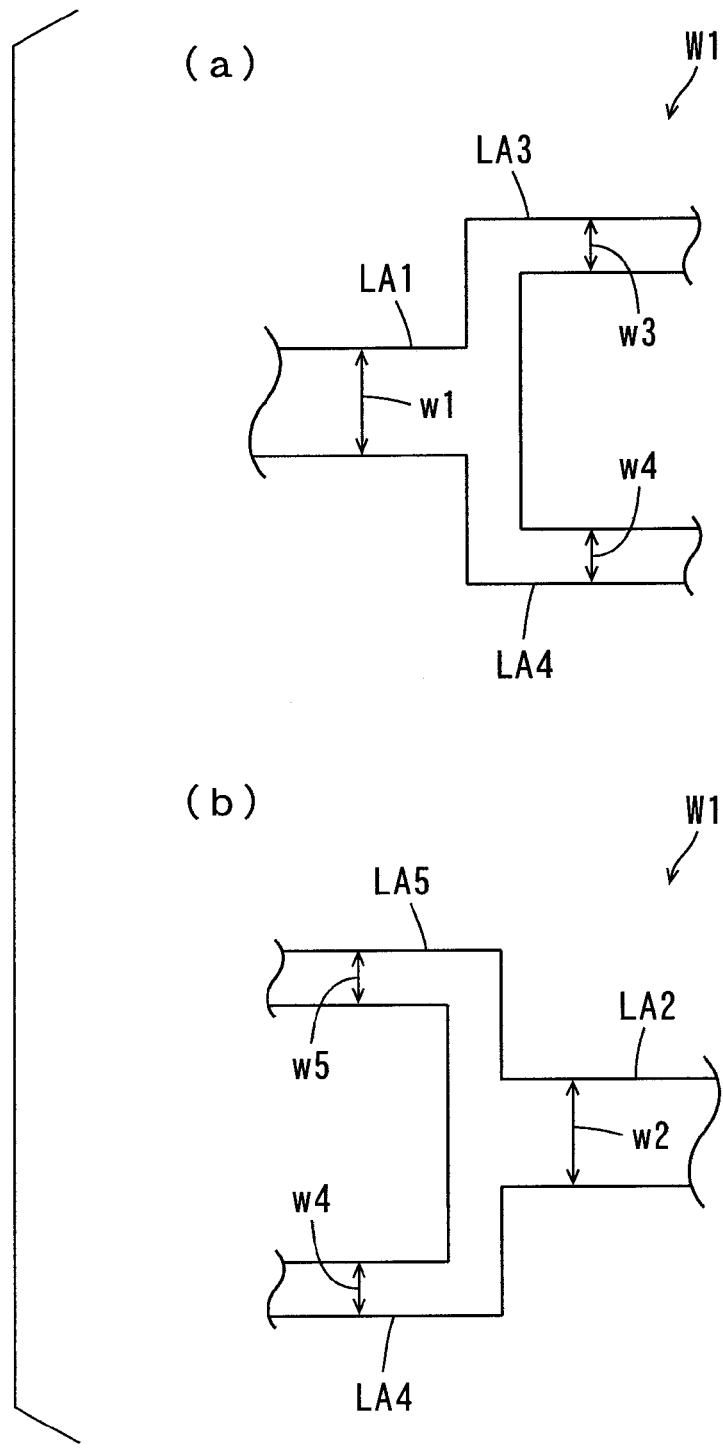
FIGS. 5(a), (b) are plan views schematically showing linked portions of lines of the write wiring pattern.

Next, description is made of the width of each of the lines constituting the write wiring patterns W1, W2. FIG. 5(a) schematically shows a linked portion of the lines LA1, LA3, LA4 of the write wiring pattern W1, and FIG. 5(b) schematically shows a linked portion of the lines LA2, LA4, LA5.

As shown in FIGS. 5(a) and (b), the widths w1, w2 of the lines LA1, LA2 of the write wiring pattern W1 are equal to each other. The lines LA3, LA4, LA5 have equal widths w3, w4, w5, each of which is smaller than each of the widths w1, w2 of the lines LA1, LA2.

Each of the widths w3, w4, w5 of the lines LA3, LA4, LA5 is preferably half each of the widths w1, w2 of the lines LA1, LA2. In the case, the characteristic impedances of the lines LA3, LA4 are substantially equal to the characteristic impedance of the line LA1, and the characteristic impedances of the lines LA4, LA5 are substantially equal to the characteristic impedance of the line LA2. This reduces transmission loss in the write wiring pattern W1.

Similarly, the widths of the lines LB1, LB2 of the write wiring pattern W2 are equal to each other. The lines LB3, LB4, LB5 have equal widths, each of which is smaller than the width of each of the lines LB1, LB2.

The width of each of the lines LB3, LB4, LB5 is preferably half the width of each of the lines LB1, LB2. In this case, the characteristic impedances of the lines LB3, LB4 are substantially equal to the characteristic impedance of the line LB1, and the characteristic impedances of the lines LB4, LB5 are substantially equal to the characteristic impedance of the line LB2. This reduces transmission loss in the write wiring pattern W2.

The widths w1 to w5 of the lines LA1 to LA5 may be set to any values if good transmission characteristics can be obtained in the write wiring pattern W1. Similarly, the widths of the lines LB1 to LB5 may be set to any values if good transmission characteristics can be obtained in the write wiring pattern W2.

(3) The Characteristic Impedances of the Write Wiring Patterns W1, W2

The characteristic impedances of the write wiring patterns W1, W2 are decreased with increasing the capacitances of the write wiring patterns W1, W2. The capacitances of the write wiring patterns W1, W2 are increased with increasing the area in which the write wiring pattern W1 and the write wiring pattern W2 are opposite to each other.

That is, the characteristic impedances of the write wiring patterns W1, W2 are decreased with increasing the area in which the write wiring pattern W1 and the write wiring pattern W2 are opposite to each other.

In the suspension board 1 according to the present embodiment, the lines LA3, LA4 constituting the write wiring pattern W1 and the lines LB4, LB5 constituting the write wiring pattern W2 are arranged in parallel with one another such that the line LA3 is positioned between the lines LB4, LB5 and the line LB5 is positioned between the lines LA3, LA4 as shown in FIG. 3. In this case, one side surface of the line LA4 of the write wiring pattern W1 and one side surface of the line LB5 of the write wiring pattern W2 are opposite to each other, the other side surface of the line LB5 of the write wiring pattern W2 and one side surface of the line LA3 of the write wiring pattern W1 are opposite to each other, and the other side surface of the line LA3 of the write wiring pattern W1 and one side surface of the line LB4 of the write wiring pattern W2 are opposite to each other. In this manner, the plurality of surfaces of the write wiring pattern W1 and the plurality of surfaces of the write wiring pattern W2 are opposite to one another, respectively.

Meanwhile, when each of the write wiring patterns W1, W2 is composed of one line, only one side surface of the write wiring pattern W1 and one side surface of the write wiring pattern W2 are opposite to each other. Accordingly, as compared with the case where each of the write wiring patterns W1, W2 is composed of one line, the total area in which the write wiring pattern W1 and the write wiring pattern W2 are opposite to each other is increased, and the characteristic impedances of the write wiring patterns W1, W2 are decreased in the present embodiment.

The write wiring patterns W1, W2 are opposite to the ground layer 43 with the first cover insulating layer 42 therebetween, and are opposite to the suspension body 10 with the base insulating layer 41 therebetween in the present embodiment. This further increases the capacitances of the write wiring patterns W1, W2. This results in further reduced characteristic impedances of the write wiring patterns W1, W2.

The distance between the ground layer 43 and the write wiring patterns W1, W2 is decreased as the thickness t1 of the first cover insulating layer 42 is reduced, so that the capacitances of the write wiring patterns W1, W2 are increased. This reduces the characteristic impedances of the write wiring patterns W1, W2. Similarly, the distance between the suspension body 10 and the write wiring patterns W1, W2 is decreased as the thickness t2 of the base insulating layer 41 is reduced, so that the capacitances of the write wiring patterns W1, W2 are increased. This reduces the characteristic impedances of the write wiring patterns W1, W2.

The smaller thickness t2 of the base insulating layer 41 results in smaller characteristic impedances of the read wiring patterns R1, R2. Comparatively large characteristic impedances are required for the read wiring patterns R1, R2 in order to properly read information from the magnetic disk. Therefore, the thickness t1 of the first cover insulating layer 42 is preferably smaller than the thickness t2 of the base insulating layer 41 in order to sufficiently reduce the characteristic impedances of the write wiring patterns W1, W2 while maintaining the characteristic impedances of the read wiring patterns R1, R2 at values suitable for reading information from the magnetic disk.

(4) Method of Manufacturing the Suspension Board

Figure 6:
FIGS. 6(a) to (c) are vertical sectional views showing steps of manufacturing the suspension board.
Figure 6:
Figure 6:
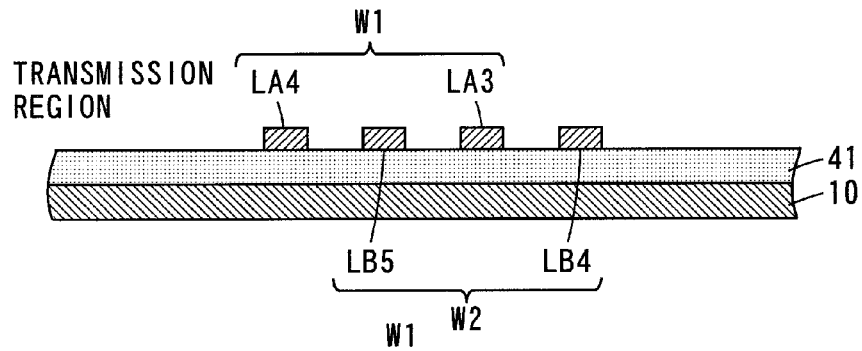
Figure 6:
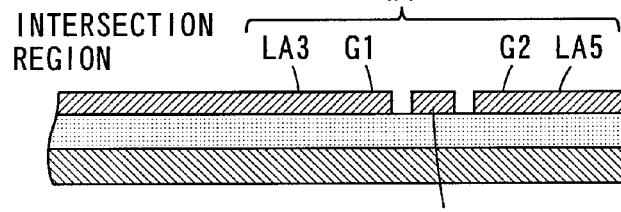
Figure 6:
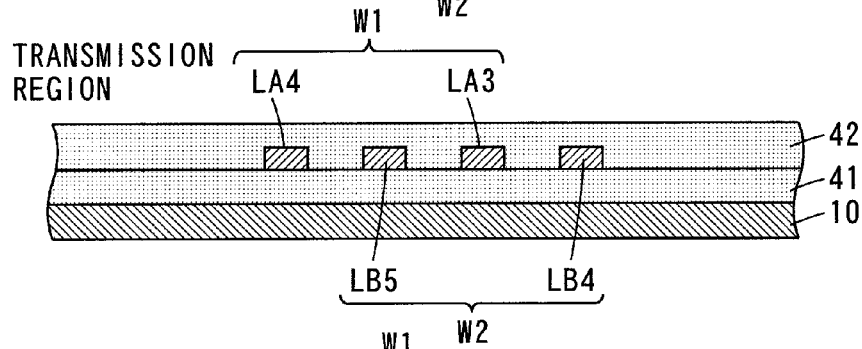
Figure 6:
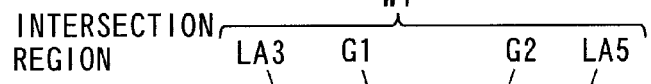
Figure 6:
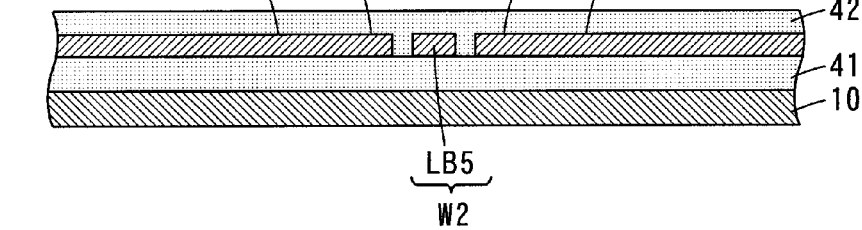
Figure 7:
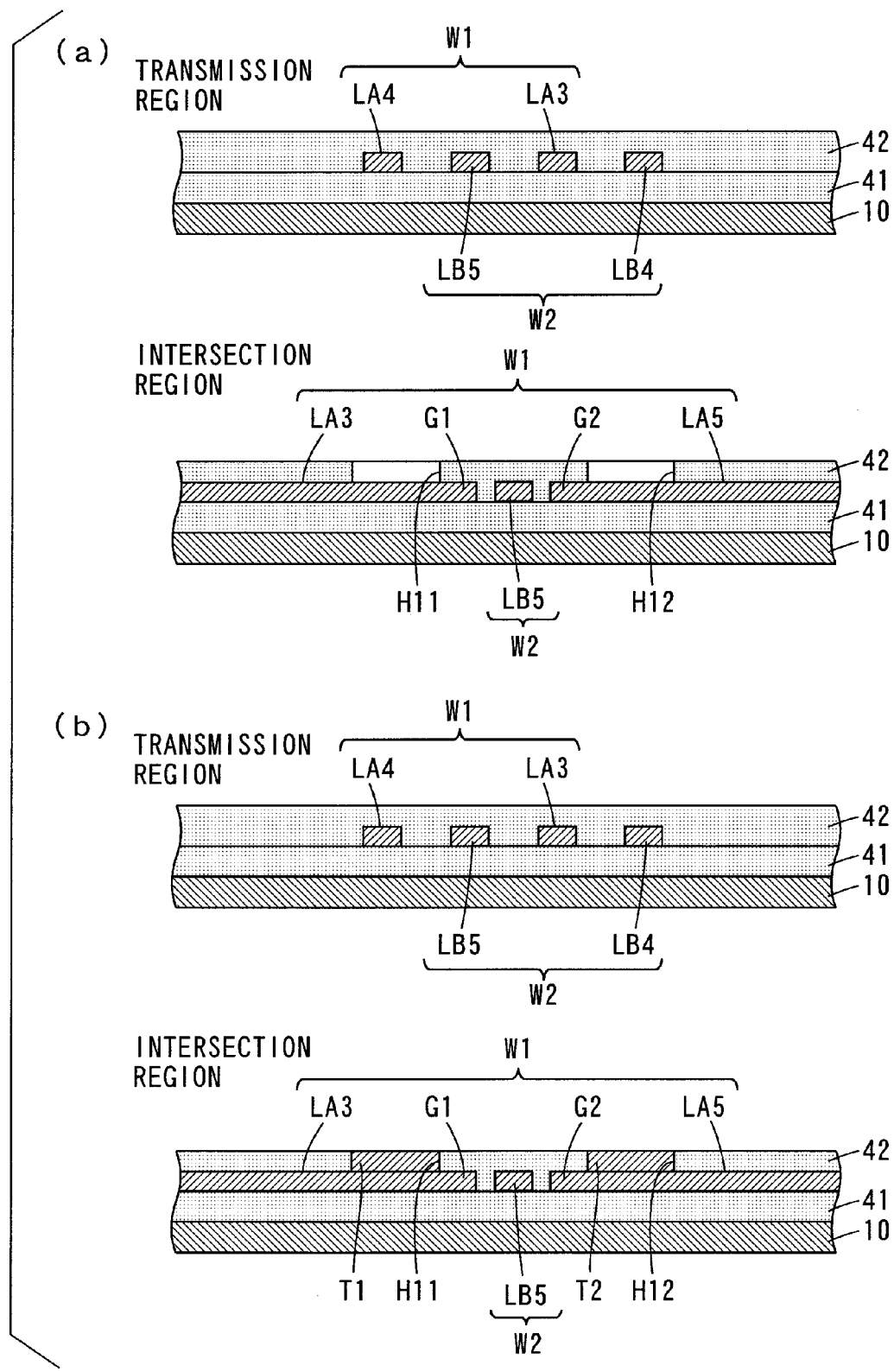
FIGS. 7(a), (b) are vertical sectional views showing steps of manufacturing the suspension board.
Figure 8:
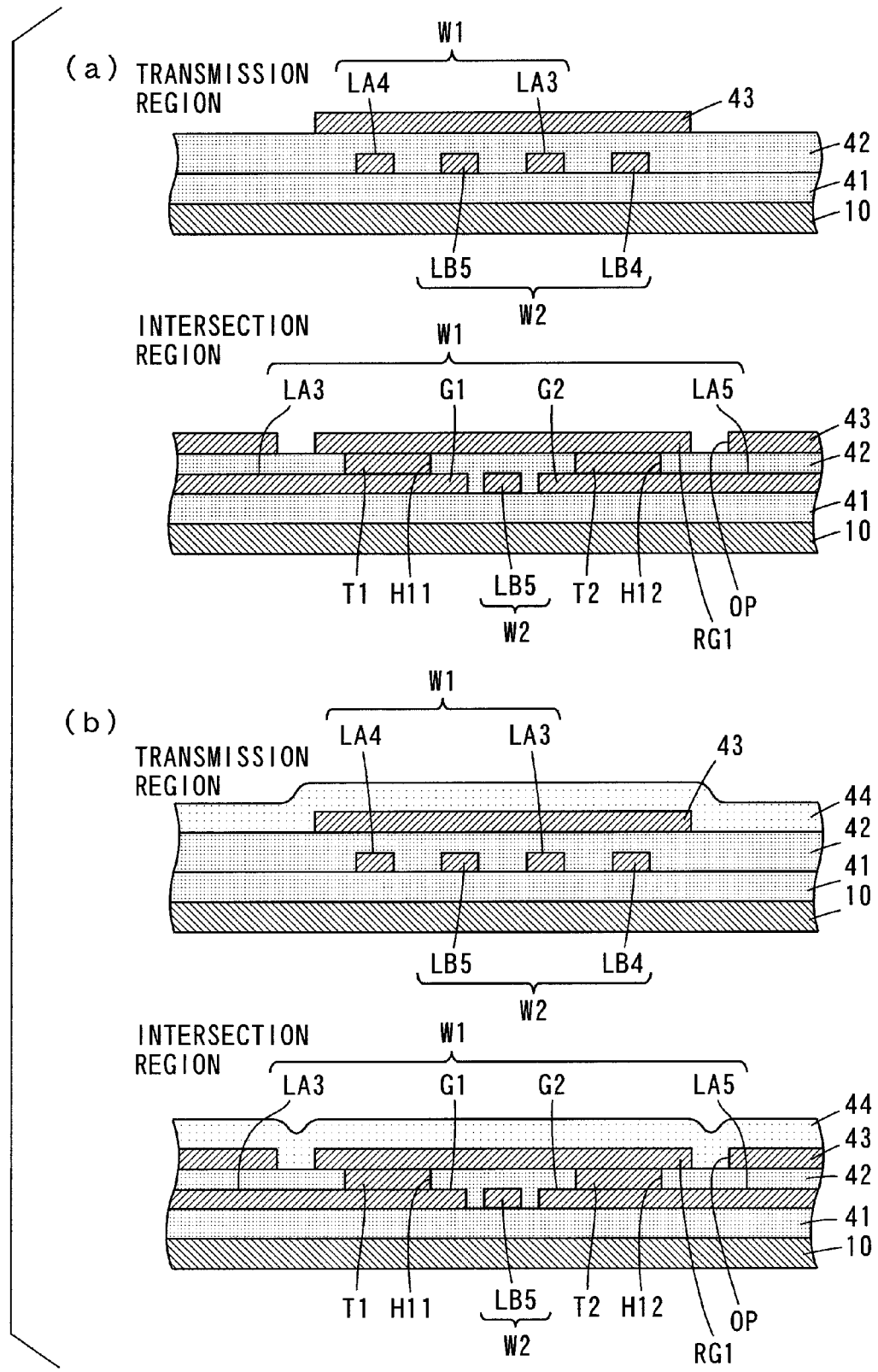
FIGS. 8(a), (b) are vertical sectional views showing steps of manufacturing the suspension board.

Next, description is made of the method of manufacturing the suspension board 1. FIGS. 6 to 8 are vertical sectional views showing steps of manufacturing the suspension board 1. Here, description is made of steps of manufacturing the lines LA3, LA4, LB4, LB5 of the write wiring patterns W1, W2 and the periphery thereof (hereinafter referred to as a transmission region) shown in FIG. 3 and steps of manufacturing the intersection region CN1 shown in FIG. 4. Upper stages of FIG. 6(a) to FIG. 8(b) show the steps of manufacturing the transmission region, and lower stages show the steps of manufacturing the intersection region CN1. Note that the ground pattern GN is not shown in FIGS. 6 to 8.

First, the base insulating layer 41 made of polyimide, for example, is laminated on the suspension body 10 of stainless steel, for example, using an adhesive as shown in FIG. 6(a).

The thickness of the suspension body 10 is not less than 5 μm and not more than 50 μm, and preferably not less than 10 μm and not more than 30 μm, for example. Instead of stainless steel, another metal such as aluminum or an alloy, for example, may be used as the material for the suspension body 10.

The thickness of the base insulating layer 41 is not less than 1 μm and not more than 15 μm, and preferably not less than 2 μm and not more than 12 μm, for example. Instead of polyimide, another insulating material such as epoxy may be used as the material for the base insulating layer 41.

The write wiring patterns W1, W2 made of copper, for example, are subsequently formed on the base insulating layer 41 as shown in FIG. 6(b). In the transmission region, the lines LA3, LA4 of the write wiring pattern W1 and the lines LB4, LB5 of the write wiring pattern W2 are arranged in parallel with one another such that the line LA3 is positioned between the lines LB4, LB5, and the line LB5 is positioned between the lines LA3, LA4.

The lines LA3, LA5 of the write wiring pattern W1 and the line LB5 of the write wiring pattern W2 are formed in the intersection region CN1. The connection portions G1, G2 are formed at the ends of the lines LA3, LA5.

The write wiring patterns W1, W2 may be formed using a semi-additive method, for example, or may be formed using another method such as a subtractive method.

The thickness of each of the write wiring patterns W1, W2 is not less than 2 μm and not more than 16 μm, and preferably not less than 3 μm and not more than 13 μm, for example. The width of each of the lines LA1, LA2, LB1, LB2 of the write wiring patterns W1, W2 is not less than 5 μm and not more than 250 μm, and preferably not less than 8 μm and not more than 150 μm, for example. The width of each of the lines LA3 to LA5, LB3 to LB5 is not less than 5 μm and not more than 200 μm, and preferably not less than 8 μm and not more than 100 μm, for example. The diameter of each of the connection portions G1, G2 is not less than 30 μm and not more than 300 μm, and more preferably not less than 50 μm and not more than 150 μm, for example. The material for the write wiring patterns W1, W2 is not limited to copper. For example, another metal such as gold (Au) or aluminum, or an alloy such as a copper alloy or an aluminum alloy may be used.

Next, the first cover insulating layer 42 made of polyimide, for example, is formed on the base insulating layer 41 to cover the write wiring patterns W1, W2 as shown in FIG. 6(c). The thickness of the first cover insulating layer 42 is not less than 3 μm and not more than 26 μm, and preferably not less than 4 μm and not more than 21 μm, for example. Instead of polyimide, another insulating material such as epoxy may be used as the first cover insulating layer 42.

In the intersection region CN1, the through holes H11, H12 are then formed by etching using a laser or wet etching, for example, in the respective portions of the first cover insulating layer 42 above the connection portions G1, G2 of the lines LA3, LA5 as shown in FIG. 7(a). The diameter of each of the through holes H11, H12 is not less than 20 μm and not more than 200 μm, and preferably not less than 40 μm and not more than 100 μm, for example.

Next, the connecting layers T1, T2 made of copper, for example, are formed to fill the through holes H11, H12 of the first cover insulating layer 42, respectively, in the intersection region CN1 as shown in FIG. 7(b). The material for the connecting layers T1, T2 is not limited to copper. For example, another metal such as gold or aluminum, or an alloy such as a copper alloy or an aluminum alloy may be used.

The ground layer 43 made of copper, for example, is subsequently formed in the region on the first cover insulating layer 42 above the write wiring patterns W1, W2 as shown in FIG. 8(a). In this case, in the intersection regions CN1, CN2, the annular opening OP is formed in the ground layer 43, so that the region RG1 of the ground layer 43 extending over the connecting layer T1 to the connecting layer T2 is separated from other regions of the ground layer 43. The thickness of the ground layer 43 is not less than 1 μm and not more than 16 μm, and preferably not less than 2 μm and not more than 13 μm, for example. The area of the region RG1 of the ground layer 43 is not less than 3200 μm² and not more than 180000 μm², and preferably not less than 5000 μm² and not more than 80000 μm², for example. The material for the ground layer 43 is not limited to copper. For example, another metal such as gold or aluminum, or an alloy such as a copper alloy or an aluminum alloy may be used.

The material for the ground layer 43 preferably has higher electrical conductivity than the material for the suspension body 10. In this case, the characteristic impedances of the write wiring patterns W1, W2 can be sufficiently reduced while the characteristic impedances of the read wiring patterns R1, R2 are maintained at values suitable for reading information from the magnetic disk.

Then, the second cover insulating layer 44 made of polyimide, for example, is formed on the first cover insulating layer 42 to cover the ground layer 43 as shown in FIG. 8(b). The thickness of the second cover insulating layer 44 is not less than 3 μm and not more than 26 μm, and preferably not less than 4 μm and not more than 21 μm, for example. Instead of polyimide, another insulating material such as epoxy may be used as the material for the second cover insulating layer 44. In this manner, the suspension board 1 is completed.

(5) Effects

In the suspension board 1 according to the present embodiment, the lines LA3, LA4 constituting the write wiring pattern W1 and the lines LB4, LB5 constituting the write wiring pattern W2 are arranged in parallel with one another such that the line LA3 is positioned between the lines LB4, LB5 and the line LB5 is positioned between the lines LA3, LA4 on the same plane. This reduces the characteristic impedances of the write wiring patterns W1, W2.

The write wiring patterns W1, W2 are opposite to the ground layer 43 with the first cover insulating layer 42 therebetween, and are opposite to the suspension body 10 with the base insulating layer 41 therebetween. This further increases the capacitances of the write wiring patterns W1, W2. This results in further reduced characteristic impedances of the write wiring patterns W1, W2.

In the present embodiment, the lines LA3, LA5 of the write wiring pattern W1 are electrically connected to each other through the region RG1 of the ground layer 43 in the intersection region CN1, and the lines LB3, LB5 of the write wiring pattern W2 are electrically connected to each other through the region RG1 of the ground layer 43 in the intersection region CN2.

In this case, the line LB5 of the write wiring pattern W2 can be arranged to pass through the portion in between the lines LA3, LA5 of the write wiring pattern W1, and the line LA3 of the write wiring pattern W1 can be arranged to pass through the portion in between the lines LB3, LB5 of the write wiring pattern W2. Therefore, the lines LA3, LA4 of the write wiring pattern W1 and the lines LB4, LB5 of the write wiring pattern W2 can be alternately arranged in parallel with one another. Accordingly, electrical connection between the electrode pads 21, 31 and between the electrode pads 22, 32 can be ensured and the characteristic impedances of the write wiring patterns W1, W2 can be reduced with the simple configuration.

Since the lines LA3, LA4 of the write wiring pattern W1 are connected to each other and the lines LB4, LB5 of the write wiring pattern W2 are connected to each other through the regions RG1 of the ground layer 43, the manufacturing steps are prevented from being complicated as compared with the case where another layer is separately formed.

Since the intersection region CN1 and the intersection region CN2 have the same configurations, the transmission loss in the intersection region CN1 and the transmission loss in the intersection region CN2 are substantially equal to each other. This does not cause the transmission characteristics of the write wiring pattern W1 to be greatly different from the transmission characteristics of the write wiring pattern W2. As a result, an operation of writing in the magnetic disk can be properly performed.

Since the ground layer 43 is formed above the write wiring patterns W1, W2, transmission characteristics of signals in the write wiring patterns W1, W2 are improved as compared with the case where the ground layer 43 is formed below the write wiring patterns W1, W2. If the ground layer 43 is formed on the base insulating layer 41 and the write wiring patterns W1, W2 are formed on the first cover insulating layer 42, irregularities are generated in a portion of the first cover insulating layer 42 above the opening OP of the ground layer 43. This causes irregularities to be generated in the write wiring patterns W1, W2 formed on the first cover insulating layer 42. Therefore, reflection of signals, for example, causes the transmission characteristics of signals in the write wiring patterns W1, W2 to be degraded. In contrast, the write wiring patterns W1, W2 are formed on the base insulating layer 41 and the ground layer 43 is formed on the first cover insulating layer 42, thereby preventing irregularities from being generated in the write wiring patterns W1, W2. This prevents the transmission characteristics of the signals in the write wiring patterns W1, W2 from being degraded.

(6) Other Embodiments (6-1)

The configurations of the write wiring patterns W1, W2 and the positions of the intersection regions, for example, may be suitably changed depending on the positions of the electrode pads 21, 22, 31, 32 or the like.

Figure 9:
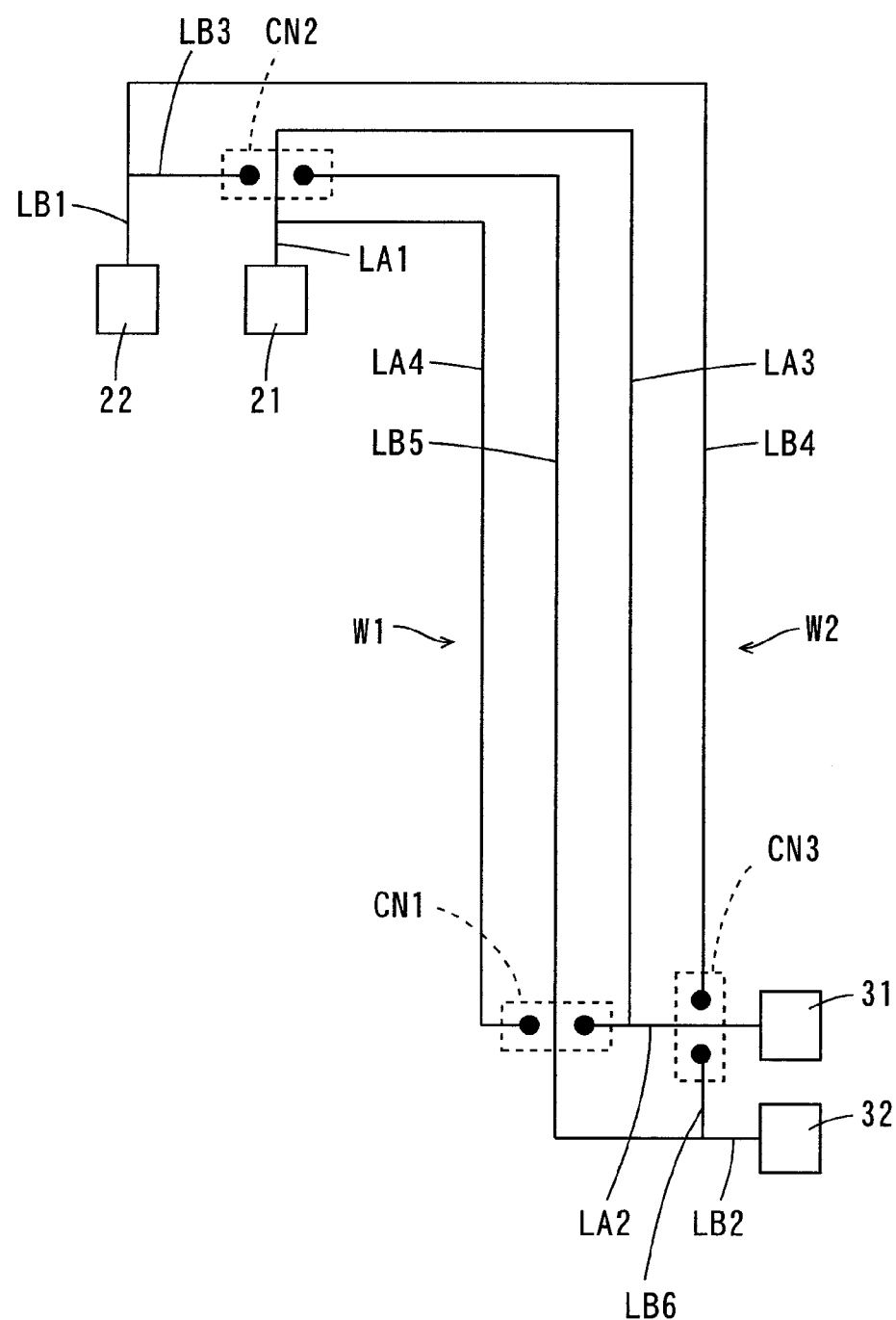
FIG. 9 is a diagram showing another example of the configurations of the write wiring patterns.

FIG. 9 is a diagram showing another example of the configurations of the write wiring patterns W1, W2. In the example of FIG. 9, the line LB4 of the write wiring pattern W2 is electrically connected to a line LB6 through an intersection region CN3. The intersection region CN3 has the same configuration as the intersection regions CN1, CN2. The line LB6 is integrated with the line LB2. The line LA2 of the write wiring pattern W1 is connected to the line LA3, and arranged to pass through a portion in between the line LB4 and the line LB6 of the write wiring pattern W2.

Also in such a case, the characteristic impedances of the write wiring patterns W1, W2 can be reduced while electrical connection between the electrode pads 21, 31 and between the electrode pads 22, 32 is ensured.

(6-2)

While the portion of the write wiring pattern W1 is electrically connected to the region RG1 of the ground layer 43 in the intersection region CN1 and the portion of the write wiring pattern W2 is electrically connected to the region RG1 of the ground layer 43 in the intersection region CN2 in the above-described embodiment, the present invention is not limited to this. A common portion of the write wiring pattern may be electrically connected to the region RG1 of the ground layer 43 in each of the intersection regions CN1, CN2.

Figure 10:
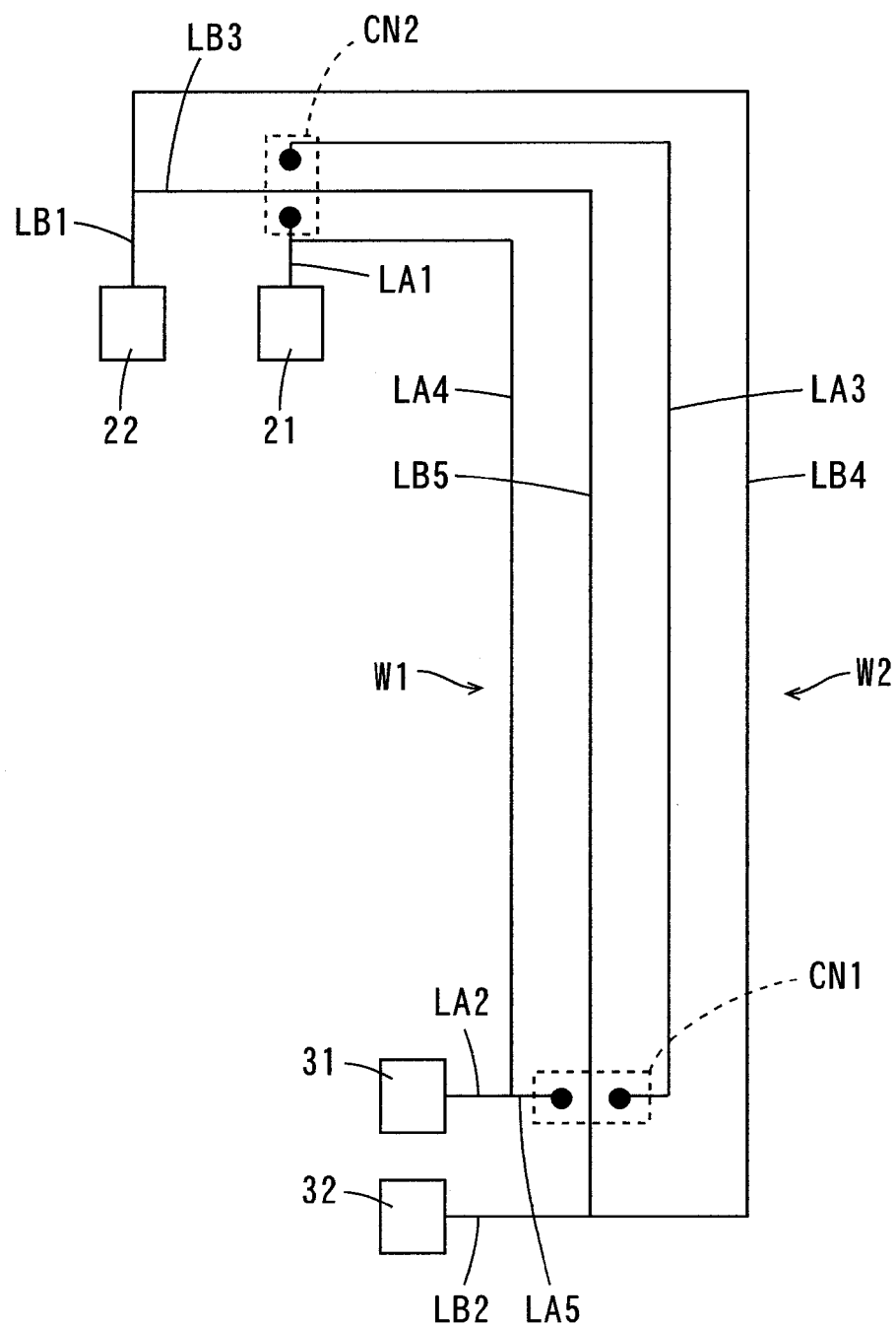
FIG. 10 is a diagram showing still another example of the configurations of the write wiring patterns.
Figure 11:
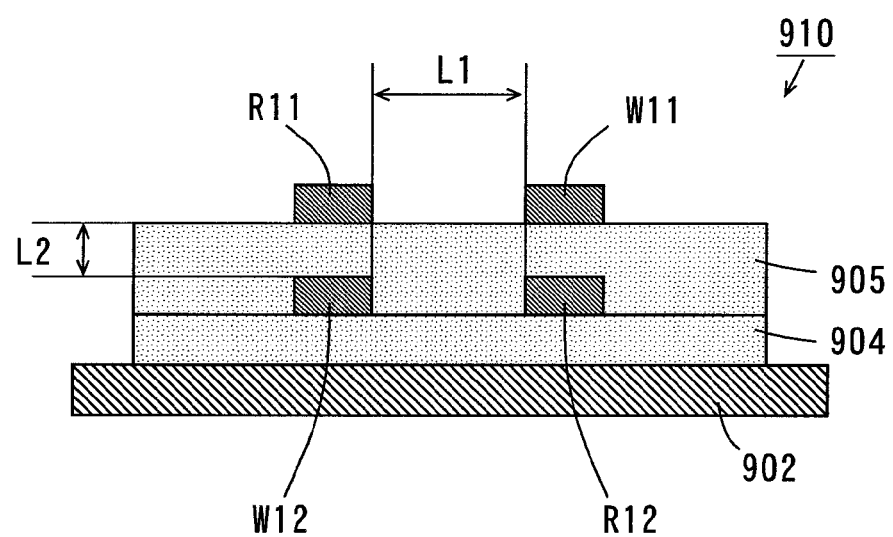
FIG. 11 is a vertical sectional view of a conventional suspension board.

FIG. 10 is a diagram showing still another example of the configurations of the write wiring patterns W1, W2. In the example of FIG. 10, the portion of the write wiring pattern W1 is electrically connected to the region RG1 of the ground layer 43 in each of the intersection regions CN1, CN2. Specifically, the line LA3 of the write wiring pattern W1 is electrically connected to the region RG1 of the ground layer 43, and the lines LA1, LA4 of the write wiring pattern W1 are electrically connected to the region RG1 of the ground layer 43 in the intersection region CN2. This causes the lines LA1, LA3, LA4 of the write wiring pattern W1 to be electrically connected to one another through the region RG1 of the ground layer 43.

Also in such a case, the characteristic impedances of the write wiring patterns W1, W2 can be decreased while electrical connection between the electrode pads 21, 31 and between the electrode pads 22, 32 is ensured.

(6-3)

While the lines LA3, LA5 are electrically connected to each other through the region RG1 of the ground layer 43 in the intersection region CN1 and the lines LB3, LB5 are electrically connected to each other through the region RG1 of the ground layer 43 in the intersection region CN2 in the above-described embodiment, the lines LA3, LA5 may be electrically connected to each other by another method, and the lines LB3, LB5 may be electrically connected to each other by another method.

For example, the lines LA3, LA5 may be electrically connected to each other through a partial region of the suspension body 10, and the lines LB3, LB5 may be electrically connected to each other through a partial region of the suspension body 10. Another conductor layer for electrically connecting the lines LA3, LA5 to each other may be separately formed, and another conductor layer for electrically connecting the lines LB3, LB5 to each other may be separately formed.

(7) Correspondences between Elements in the Claims and Parts in Embodiments

In the following paragraphs, non-limiting examples of correspondences between various elements recited in the claims below and those described above with respect to various preferred embodiments of the present invention are explained.

In the foregoing embodiments, the write wiring pattern W1 is an example of a first wiring pattern, the write wiring pattern W2 is an example of a second wiring pattern, and the first cover insulating layer 42 is an example of a cover insulating layer and is also an example of first and second cover portions.

The regions RG1 of the ground layer 43 are examples of first and second connection regions, the lines LA3, LA5 are examples of a first line, the line LA4 is an example of a second line, the lines LB3, LB5 are examples of a third line, the line LB4 is an example of a fourth line, the line LA1 is an example of a fifth line, the line LA2 is an example of a sixth line, the line LB1 is an example of a seventh line, the line LB2 is an example of an eighth line, the intersection region CN1 is an example of a first intersection region, the intersection region CN2 is an example of a second intersection region, the through hole H11 is an example of each of first and third through holes, and the through hole H12 is an example of each of second and fourth through holes.

As each of various elements recited in the claims, various other elements having configurations or functions described in the claims can be also used.

While preferred embodiments of the present invention have been described above, it is to be understood that variations and modifications will be apparent to those skilled in the art without departing the scope and spirit of the present invention. The scope of the present invention, therefore, is to be determined solely by the following claims.

We claim:

1. A printed circuit board comprising:
a metal support substrate;
a base insulating layer formed on said metal support substrate;
first and second wiring patterns formed on said base insulating layer and constituting a signal line pair;
a cover insulating layer formed on said base insulating layer to cover at least part of said first and second wiring patterns; and
a ground layer provided on said cover insulating layer to be positioned above said first and second wiring patterns, wherein
said first wiring pattern includes first and second lines having ends,
said second wiring pattern includes third and fourth lines having ends,
one of the ends of each of said first and second lines is electrically connected to each other, and an other ends of each of said first and second lines is electrically connected to each other,
one of the ends of each of said third and fourth lines is electrically connected to each other, and an other end of each of said third and fourth lines is electrically connected to each other, and
any one of said first and second lines is arranged between said third and fourth lines, and any one of said third and fourth lines is arranged between said first and second lines, wherein
a first intersection region in which said first or second line of said first wiring pattern and said third or fourth line of said second wiring pattern intersect with each other is provided,
a second intersection region in which said first or second line of said first wiring pattern and said third or fourth line of said second wiring pattern intersect with each other is provided,
a portion of said first or second line of said first wiring pattern arranged in said first intersection region is divided, a portion of said third or fourth line of said second wiring pattern arranged in said first intersection region is arranged on said base insulating layer to pass through a portion in between divided portions of said first or second line of said first wiring pattern,
said cover insulating layer includes a first cover portion having first and second through holes and provided to cover said first and second wiring patterns in said first intersection region,
said ground layer has a first connection region provided on said first cover portion and electrically separated from other regions of said ground layer,
one of said divided portions of said first or second line of said first wiring pattern is electrically connected to said first connection region through said first through hole of said first cover portion, and the other one of said divided portions of said first or second line of said first wiring pattern is electrically connected to said first connection region through said second through hole of said first cover portion.

2. The printed circuit board according to claim 1, wherein said cover insulating layer includes a second cover portion having third and fourth through holes and provided to cover said first and second wiring patterns in said second intersection region,
said ground layer further includes a second connection region provided on said second cover portion and electrically separated from the other regions of said ground layer,
a portion of said third or fourth line of said second wiring pattern arranged in said second intersection region is divided, a portion of said first or second line of said first wiring pattern arranged in said second intersection region is arranged on said base insulating layer to pass through a portion in between divided portions of said third or fourth line of said second wiring pattern, and
one of said divided portions of said third or fourth line of said second wiring pattern is electrically connected to said second connection region through said third through hole of said second cover portion, and the other one of said divided portions of said third or fourth line of said second wiring pattern is electrically connected to said second connection region through said fourth through hole of said second cover portion.

3. The printed circuit board according to claim 2, wherein the other regions excluding said first and second connection regions of said ground layer is electrically connected to said metal support substrate.

4. The printed circuit board according to claim 2, wherein a thickness of said cover insulating layer is smaller than a thickness of said base insulating layer.

5. The printed circuit board according to claim 2, further comprising:
a fifth line branched from the one end of said first line or the one end of said second line;
a sixth line branched from the other end of said first line or the other end of said second line;

a seventh line branched from the one end of said third line or the one end of said fourth line; and an eighth line branched from the other end of said third line or the other end of said fourth line, wherein a width of each of said fifth line and said sixth line is obtained by adding a width of said first line and a width of said second line, and a width of each of said seventh line and said eighth line is obtained by adding a width of said third line and a width of said fourth line.

6. A method of manufacturing a printed circuit board, comprising the steps of:

forming a base insulating layer on a metal support substrate;

forming first and second wiring patterns that constitute a signal line pair on said base insulating layer;

forming a cover insulating layer on said base insulating layer to cover at least part of said first and second wiring patterns; and forming a ground layer on said cover insulating layer such that the ground layer is positioned above said first and second wiring patterns, wherein said step of forming said first and second wiring patterns includes the step of forming said first and second wiring patterns on said base insulating layer such that said first wiring pattern is composed of first and second lines having ends and said second wiring pattern is composed of third and fourth lines having ends, one of the ends of each of said first and second lines is electrically connected to each other, an other end of each of said first and second lines is electrically connected to each other, one of the ends of each of said third and fourth lines are electrically connected to each other, an other end of each of said third and fourth lines is electrically connected to each other, any one of said first and second lines of said first wiring pattern is positioned between said third and fourth lines of said second wiring pattern, and any one of said third and fourth lines of said second wiring pattern is positioned between said first and second lines of said first wiring pattern, wherein a first intersection region in which said first or second line of said first wiring pattern and said third or fourth line of said second wiring pattern intersect with each other is provided, a second intersection region in which said first or second line of said first wiring pattern and said third or fourth line of said second wiring pattern intersect with each other is provided, a portion of said first or second line of said first wiring pattern arranged in said first intersection region is divided, a portion of said third or fourth line of said second wiring pattern arranged in said first intersection region is arranged on said base insulating layer to pass through a portion in between divided portions of said first or second line of said first wiring pattern, said cover insulating layer includes a first cover portion having first and second through holes and provided to cover said first and second wiring patterns in said first intersection region, said ground layer has a first connection region provided on said first cover portion and electrically separated from other regions of said ground layer, one of said divided portions of said first or second line of said first wiring pattern is electrically connected to said first connection region through said first through hole of said first cover portion, and the other one of said divided portions of said first or second line of said first wiring pattern is electrically connected to said first connection region through said second through hole of said first cover portion.

* * * * *